US012623900B1

(12) United States Patent
Miller et al.

(10) Patent No.: US 12,623,900 B1
(45) Date of Patent: May 12, 2026

(54) MEMS WITH OVER-VOLTAGE PROTECTION

(71) Applicant: SiTime Corporation, Santa Clara, CA (US)

(72) Inventors: Nicholas Miller, Sunnyvale, CA (US); Ginel C. Hill, Sunnyvale, CA (US); Charles I. Grosjean, Los Gatos, CA (US); Michael Julian Daneman, Campbell, CA (US); Paul M. Hagelin, Saratoga, CA (US); Aaron Partridge, Cupertino, CA (US)

(73) Assignee: SiTime Corporation, Sunnyvale, CA (US)

( * ) Notice: Subject to any disclaimer, the term of this patent is extended or adjusted under 35 U.S.C. 154(b) by 890 days.

(21) Appl. No.: 17/701,963

(22) Filed: Mar. 23, 2022

Related U.S. Application Data

(62) Division of application No. 16/915,696, filed on Jun. 29, 2020, now Pat. No. 11,312,622, which is a division of application No. 15/911,045, filed on Mar. 2, 2018, now Pat. No. 10,737,934.

(60) Provisional application No. 62/465,894, filed on Mar. 2, 2017.

(51) Int. Cl.
*B81B 7/02* (2006.01)
*B81C 1/00* (2006.01)
*H02H 9/04* (2006.01)
*H10W 70/60* (2026.01)

(52) U.S. Cl.
CPC ............ *B81B 7/02* (2013.01); *B81C 1/00063* (2013.01); *B81C 1/00095* (2013.01); *H02H 9/045* (2013.01); *H10W 70/60* (2026.01)

(58) Field of Classification Search
CPC ... B81B 7/02; B81C 1/00063; B81C 1/00095; H01L 24/18; H01L 2924/1461
See application file for complete search history.

(56) References Cited

U.S. PATENT DOCUMENTS

| | | | |
|---|---|---|---|
| 9,991,868 B1 * | 6/2018 | Nguyen | ............ G01C 19/5691 |
| 2006/0049463 A1 | 3/2006 | Kim | |
| 2014/0117470 A1 * | 5/2014 | Baskaran | ............. B81B 7/0006 257/415 |
| 2017/0081174 A1 * | 3/2017 | Liu | ..................... B81C 1/00301 |
| 2017/0207214 A1 * | 7/2017 | Or-Bach | ............... H10D 84/85 |
| 2018/0096985 A1 | 4/2018 | Weyers | |

* cited by examiner

*Primary Examiner* — Moazzam Hossain

(57) ABSTRACT

A semiconductor device includes first and second exposed electrical contacts and a cavity having a microelectromechanical system (MEMS) structure therein. A conductive path extends from the first exposed electrical contact to the cavity and an over-voltage protection element electrically is coupled between the first and second exposed electrical contacts.

22 Claims, 7 Drawing Sheets metal
heavily-doped polysilicon
n-type silicon
p-type silicon 235
237
239 n
p

223

A
A A'
A' d1
d2
d3 d3>d2>d1 → G1>G2>G3
(relative hot-spot across path d1)

221 disparate path geometry metal
n-type cathode path-matched geometry

B' B
B' B
B' d1
d2
d3

223 d3≈d2≈d1 → G1≈G2≈G3

B

225 silicon layer (plan view)

n-doped trench-fill n-doped cavity-fill post-anneal n-regions floating interior p-region silicon layer (plan view)

post-anneal n-well n-doped trench-fill

Silicon Layer (p-type)

FIG. 15   Terminal/OPD Interconnection

MEMS WITH OVER-VOLTAGE PROTECTION

CROSS-REFERENCE TO RELATED APPLICATIONS

This application is a division of U.S. patent application Ser. No. 16/915,696, filed on Jun. 29, 2020, on behalf of first-named inventor Nicholas Miller for "Mems With Over-Voltage Protection," which in turn a division of U.S. patent application Ser. No. 15/911,045, filed on Mar. 2, 2018, on behalf of first-named inventor Nicholas Miller for "Mems With Over-Voltage Protection" (now U.S. Pat. No. 10,737, 934), which in turn claims priority to U.S. Provisional Patent Application No. 62/465,894 filed Mar. 2, 2017; each afore-mentioned patent application is hereby incorporated by reference.

TECHNICAL FIELD

The disclosure herein relates to microelectromechanical systems (MEMS).

DRAWINGS

The various embodiments disclosed herein are illustrated by way of example, and not by way of limitation, in the figures of the accompanying drawings and in which like reference numerals refer to similar elements and in which.

Figures 7, 8, 9:
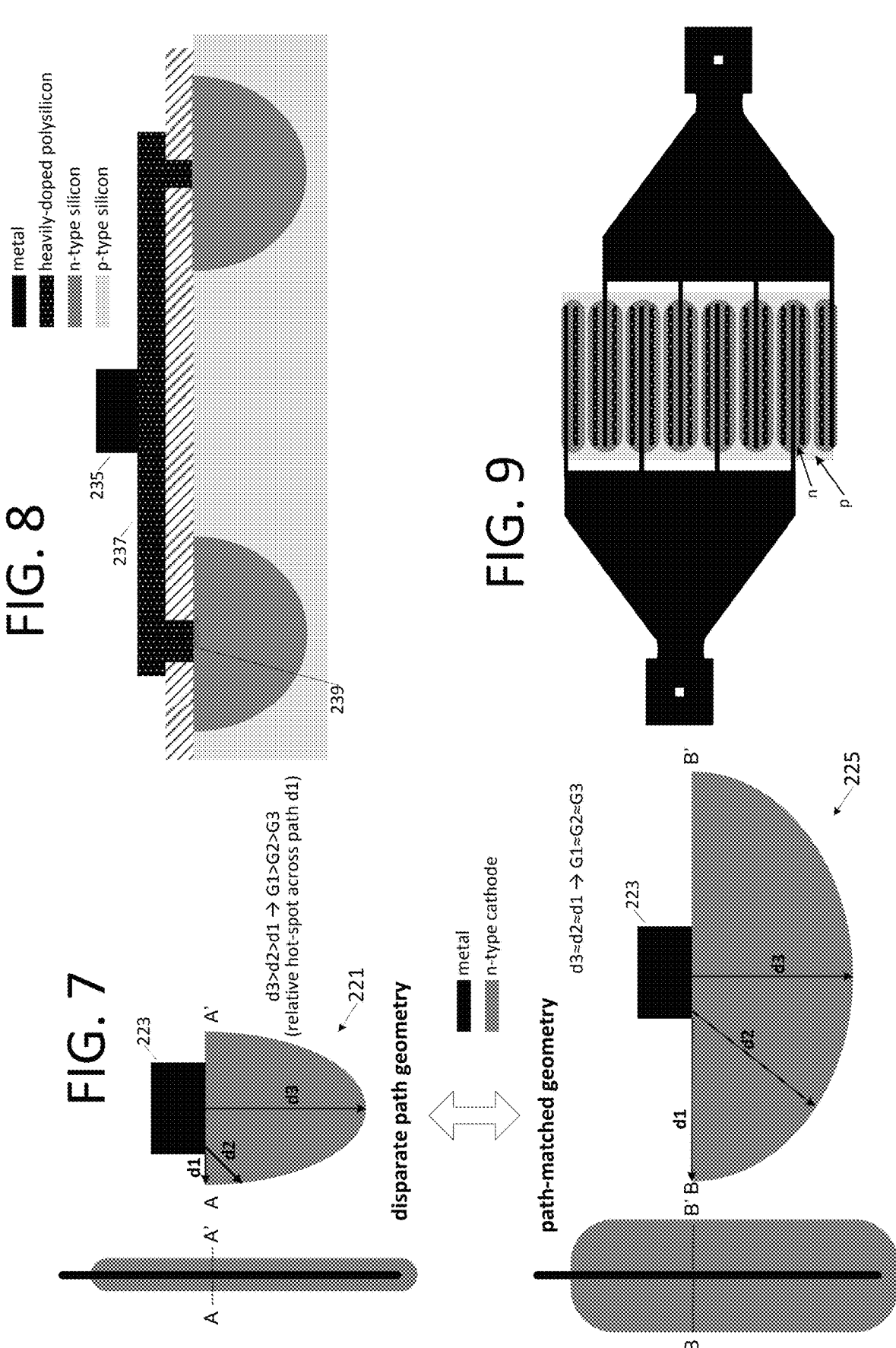
Figures 10, 11:
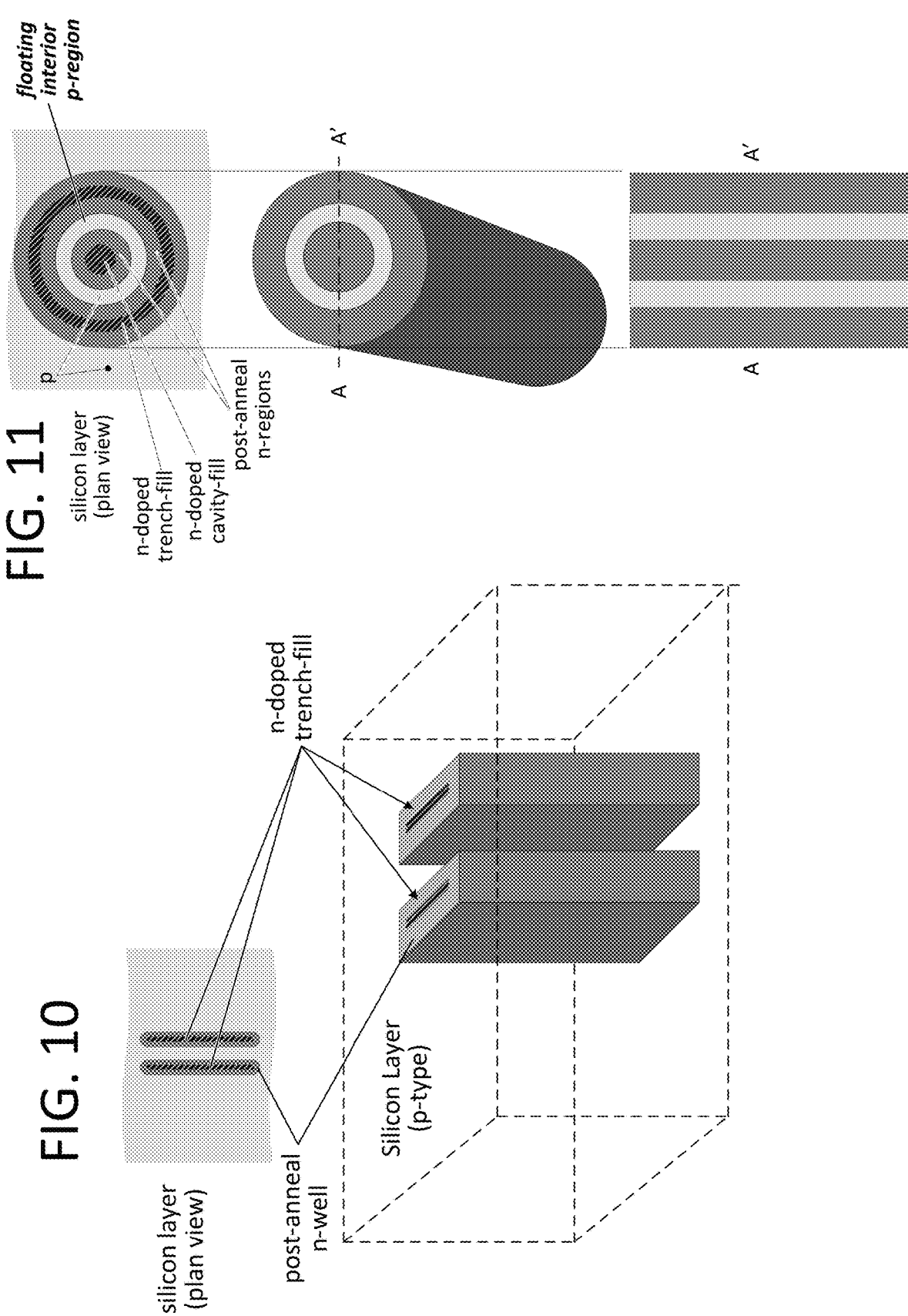
Figures 12, 13, 14:
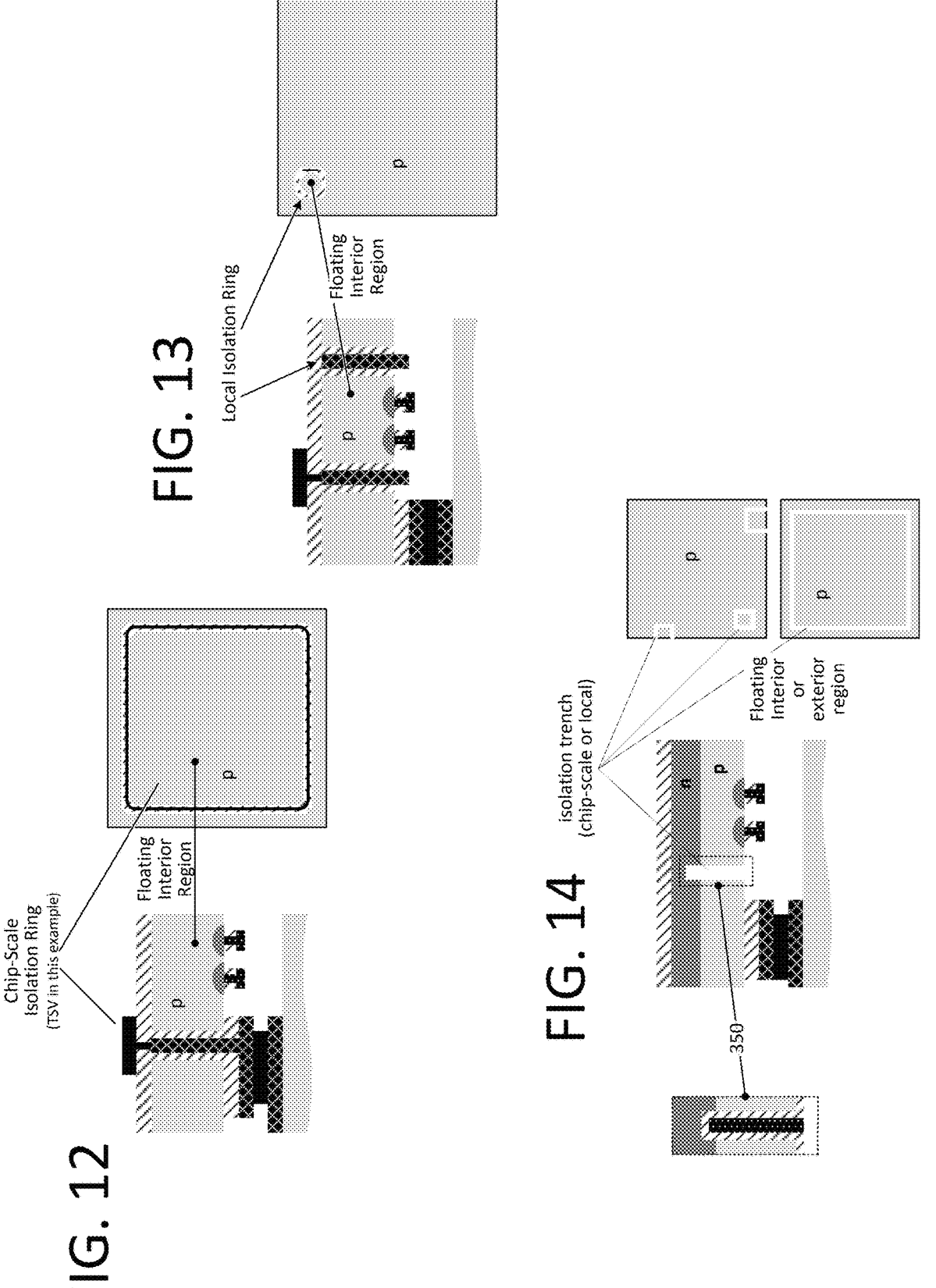

FIG. 7 contrasts current conduction path lengths within a generalized dopant diffusion profile with those in a path-matched dopant diffusion geometry;

FIG. 8 illustrates an exemplary conductor-to-cathode interconnect implemented with a material that intrinsically equilibrates current flow through the OPD;

FIG. 9 illustrates a top-view of an interdigitated diode pair in which metal contact fingers are ballasted by heavily-doped polysilicon cathode-interconnect structures;

FIGS. 10 and 11 illustrate exemplary embodiments of through-silicon OPD structures;

FIGS. 12-14 illustrate alternative structures for electri-cally isolating the floating p-type region of an OPD; and FIG. 15 illustrates exemplary interconnections between contacts (terminals) and over-voltage protection devices implemented in various silicon layers of a MEMS device.

DETAILED DESCRIPTION

MEMS devices having voltage-stress-protected contacts coupled to electrodes within or adjacent a sealed interior chamber are disclosed in various embodiments herein. In a number of implementations, a MEMS resonator within the sealed chamber may be rendered to resonant motion by an actuation signal conducted via one or more of the exposed contacts-motion that produces a periodic output signal con-ducted from a sense electrode on or near the resonator to another of the exposed contacts. Over-voltage protection elements coupled respectively to the actuation signal contact and output signal contact (and extending, for example, from those contacts to a ground or other reference voltage node) limit the contact voltage to a target voltage-stress threshold, breaking down and conducting/discharging current when the voltage between the signal contact (actuation or output) and reference node rises above the threshold. In other embodi-ments, particularly those in which the voltage across a pair of signal contacts will develop across the resonator or other MEMS element, an over-voltage protection element may be coupled directly between the signal contact pair thus limit-ing the cross-resonator voltage to the target threshold. These and other features and embodiments are described in further detail below.

Figure 1:
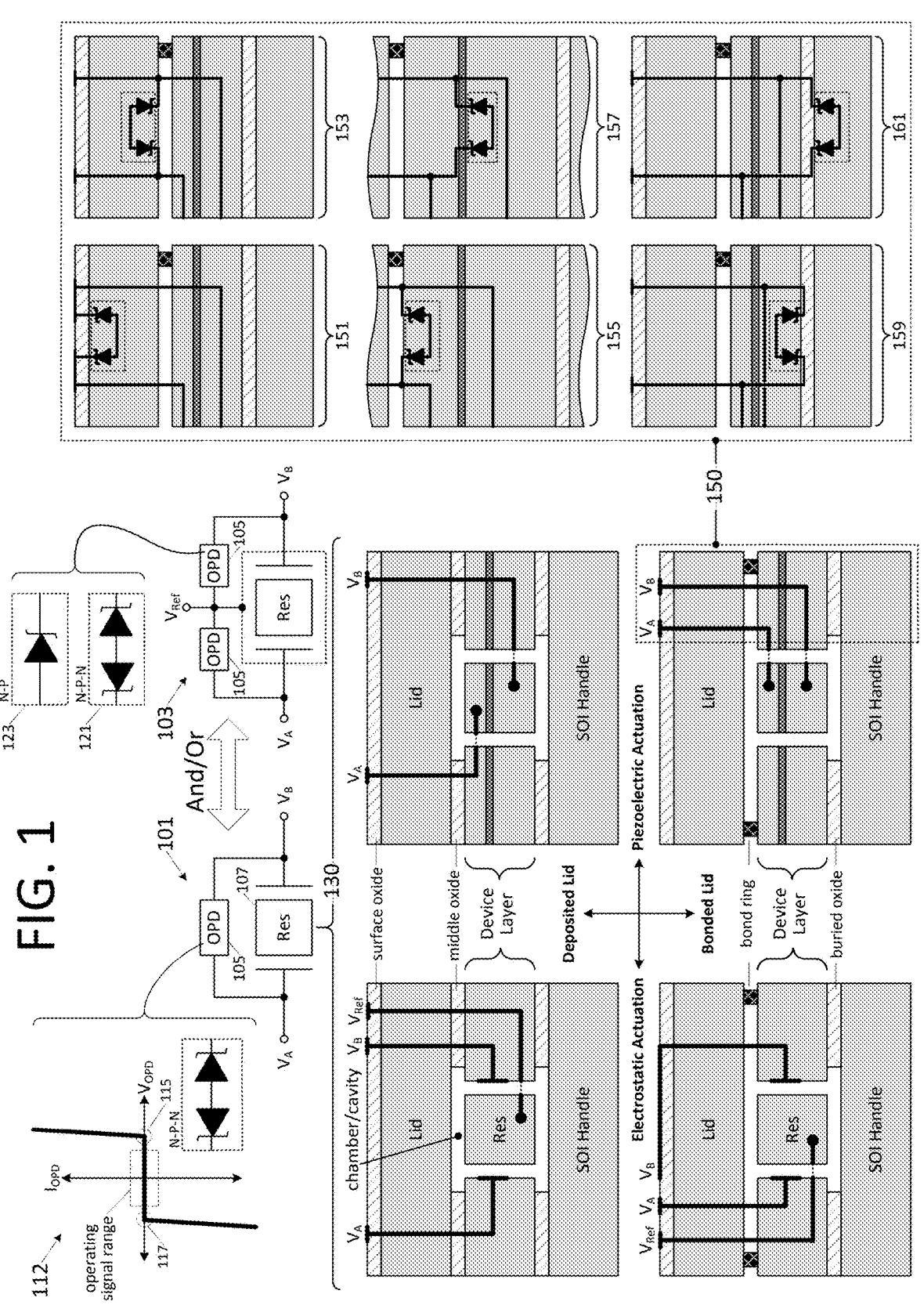
FIG. 1 illustrates various exemplary configurations of over-voltage protection elements with respect to a cham-bered MEMS element.

FIG. 1 illustrates various exemplary configurations of over-voltage protection elements (or over-voltage protection devices, OPDs) with respect to a chambered MEMS ele-ment-generally depicted and referred to herein as a MEMS resonator, though MEMS thermistors, accelerometer mass structures, optical refractors or any other practicable micro-machined element that may benefit from over-voltage pro-tection may be disposed within the chamber (or cavity, enclosure, housing, etc.) and coupled to one or more exposed electrical contacts. In one embodiment, shown schematically at 101, an over-voltage protection device 105 formed by back-to-back n-p semiconductor junctions (i.e., a p-type semiconductor region sandwiched between contact-side n-type regions) is coupled between a pair of exposed contacts $V_A$ and $V_B$, in effect forming back-to-back diodes between those contacts (i.e., diodes coupled anode-to-anode in series). Each n-p junction (i.e., "reverse-bias" junction) is characterized by a breakdown voltage (e.g., a Zener or avalanche breakdown effect in which charge conduction is triggered by a potential difference greater than the break-down threshold) and thus begins conducting above that breakdown threshold. Accordingly, by engineering the breakdown voltage to meet an over-stress threshold, oper-ating signal voltages below that threshold may be applied or developed across the exposed contacts without activating (i.e., rendering current conduction through) the over-protec-tion voltage devices, enabling operation of the MEMS device per design. By contrast, cross-contact voltages above the threshold (i.e., the breakdown voltage indicated by the positive and negative knees 115, 117 in the I-V curve at 112) will break down the n-p semiconductor junction (Zener, avalanche, etc.) such that a discharge current flows through the over-voltage protection device, a current flow that bypasses operating features of the MEMS device (e.g., MEMS resonator 107 or other element, electrodes, etc.) and limits the cross-contact voltage to a non-destructive level.

Continuing with FIG. 1, instead of or in addition to interconnection between signal contacts, an over-voltage protection device may be coupled between each signal contact and a reference voltage contact (e.g., "$V_{Ref}$" which may be a ground contact, bias voltage contact, supply voltage contact, etc.) as shown at 103, and/or between any two such reference voltage contacts (e.g., over-voltage pro-tection element coupled between bias-voltage contact and ground contact). Where the reference voltage contact is to remain at a lower potential than the counterpart contact(s) during device operation (e.g., all signals to remain above ground contact potential during device operation), over-voltage protection device 105 may be reduced to a single n-p junction as shown by the alternatives at 121 and 123 (i.e., single reverse-bias diode 123 instead of back-to-back diode configuration 121). In either OPD implementation, cross-contact voltages above the over-voltage threshold will trigger bypass current conduction through the over-voltage protection devices to limit the applied voltage and thereby avoid damage to sensitive material layers or structures within the MEMS device. Also, in all back-to-back diode embodiments, the p-type region between junction boundaries may be sufficiently narrow to enable carrier transit without recombination, thus effecting a floating-base bipolar junction transistor (BJT) capable of snap-back—that is, current flow onto the BJT base during a break-down event will raise the base voltage and thus turn on the transistor until the over-voltage source is drained to ground and the transistor switches off).

Still referring to FIG. 1, OPD implementation may vary according to MEMS device type and construction. With respect to MEMS resonator devices, for example, the MEMS cavity may be capped by either a bonded semiconductor "lid" (generally leaving an interstitial void that forms part of the MEMS cavity) or by material deposition (e.g., epitaxial silicon growth/deposition), options bearing on OPD location, structure, interconnection and so forth. Similarly, the resonator material composition may vary according to actuation type, presence or absence of additional micromachined elements (e.g., thermistor, other resonator(s), etc.), packaging solution, and so forth. For example, in a number of piezoelectrically-actuated resonator embodiments, a relatively thin piezoelectric material layer—aluminum nitride or other film easily damaged by electrostatic discharge or other over—voltage stress—is disposed over a single-crystal silicon resonator body to serve as an actuation element, motional signal generator or both. Exemplary electrostatically and piezoelectrically actuated MEMS resonator devices are shown in the left and right halves, respectively, of expanded view 130, in both cases with either bonded or deposited lid layers. Signal contacts $V_A$ and $V_B$ and corresponding conductor routing to electrodes within or adjacent the resonator cavity are shown conceptually in each case. Reference contact ($V_{Ref}$—ground, bias, supply voltage, etc.) is shown only with respect to the electrostatically actuated MEMS resonator devices but may be present within the piezo-electrically actuated resonator devices as well. While exposed electrical contacts ($V_A$, $V_B$, $V_{Ref}$) are depicted at a surface oxide (i.e., oxide or other dielectric formed over lid layer), any one or more of those contacts or any other contacts may be exposed instead at the bottom semiconductor layer—generally shown and described herein as the handle layer of a silicon-on-insulator (SOI) starting wafer having a buried oxide and a silicon device layer in which the MEMS resonator (and/or other MEMS element) is formed. Also, while exposed contacts $V_A$ and $V_B$ are routed to on-resonator electrodes above and below the piezoelectric layer in the piezoelectrically-actuated embodiments, those contacts may be routed to electrically distinct electrodes on the same side of the piezoelectric layer in alternative embodiments (e.g., signal and drive contacts routed to respective electrodes above the piezoelectric layer, while a ground contact or bias-voltage contact is routed to a highly doped single-crystal silicon layer beneath the piezoelectric layer).

Over-voltage protection devices may be disposed at various locations in each of the MEMS resonator arrangements shown at 130, including those shown in detail view 150 (i.e., applying the bonded-lid, piezoelectrically-actuated MEMS resonator as a representative example). That is, the OPD may be implemented within the lid-layer immediately beneath the surface oxide (151) or at the underside of the lid-layer (153); or above or below the piezoelectric layer of the device-layer material stack and, in the latter case, at the piezoelectric layer boundary or the buried oxide boundary (155, 157 and 159, respectively); or within the handle layer at the outer surface or adjacent the buried-oxide boundary (161). Within each of the material layers (lid, device and handle layers in the depicted embodiments), the over-voltage protection device may include one or more structures that extend through the entirety of that layer or any component layer thereof.

Figure 2:
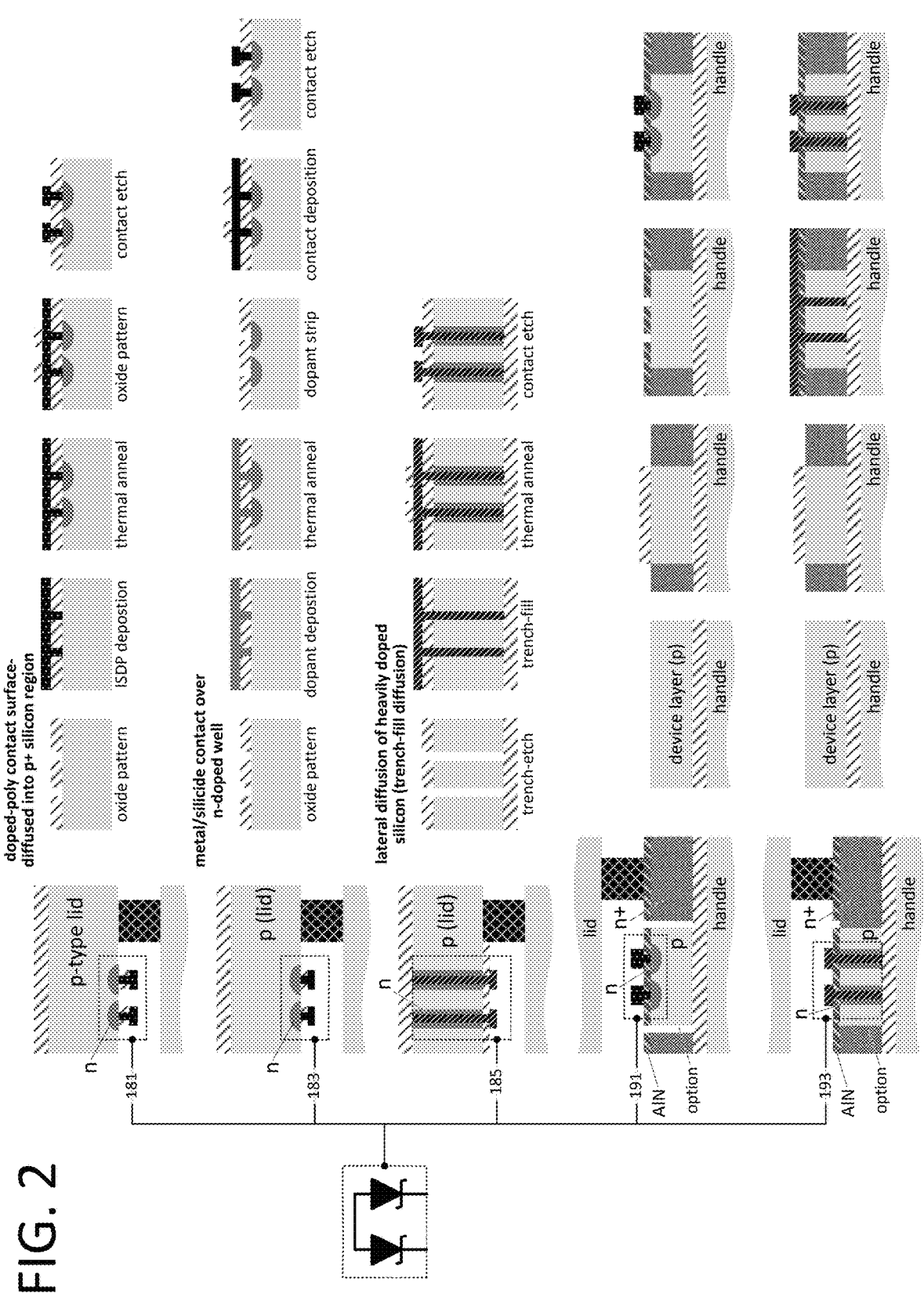
FIG. 2 illustrates exemplary over-voltage protection device (OPD) implementations within a silicon lid-layer and also within the single-crystal silicon layer of a device-layer material stack.

FIG. 2 illustrates exemplary OPD implementations within a silicon lid-layer and also within an n-doped single-crystal silicon layer of a device-layer material stack (the latter including, for example, an aluminum nitride (AlN) piezoelectric layer). The lid-layer silicon OPDs (181, 183, 185) are implemented by n-type diffusion, implantation or other doping at the interior surface of the silicon lid—structures that may alternatively be instantiated at the surface boundary of any of the silicon layers (e.g., exterior lid surface, upper or lower surfaces of device-layer silicon, or upper or lower surfaces of handle layer silicon). Moreover, while OPD contacts are depicted extending into an interstitial cavity between device and lid layers, OPD contacts may alternatively be routed between or within oxide or other dielectric material layers, particularly where lid-layer silicon is deposited instead of wafer bonded.

In the OPD implementation shown at 181, in-situ-doped polysilicon (ISDP) is deposited over patterned oxide and then diffused into a p-type silicon lid-layer (i.e., heat and temperature in a thermal drive cycle) to form an n-p-n structure and thus back-to-back diodes. The ISDP layer is patterned thereafter to form over-oxide conductors coupled to respective contacts and internal MEMS features (e.g., drive or sense electrodes, bias-voltage electrodes, ground nodes, etc.) Breakdown voltage of the diodes (whether Zener or avalanche) may be controlled through dopant concentration, diffusion depth, junction area, and so forth.

The OPD shown at 183 is structurally similar to OPD 181, but implemented by doping the n-wells with a dopant material distinct from the conductive interconnect (contact) material. In one embodiment, for example, doped glass is grown within the patterned oxide (filling the trenches) and then thermally diffused into the p-type silicon to form the OPD, followed by stripping (the glass) and back-fill with degenerately doped poly or metal form the OPD interconnect.

The OPD at 185 includes a pair of through-silicon trenches (through the silicon lid-layer in this example) lined by n-doped walls and filled or further lined with conductive material. As shown, the n-doped sidewalls of the two trenches are separated by a portion of the p-type silicon layer and thus implement constituent back-to-back diodes of the OPD. In a number of embodiments, one of the trenches is patterned to encompass (form a perimeter about) the other, thus electrically isolating and floating the p-region therebetween—a beneficial arrangement that obviates additional structures that may otherwise be needed to float the shared anode of the back-to-back diodes (or BJT base). Further, the conductive trench-fill material may serve dual duty as a dopant source (e.g., trench-fill with ISDP) that may be annealed into the trench walls to form the n-type cathodes of the OPD diodes (or BJT emitter/collector). In the embodiment shown, the conductive material extends through the patterned under-lid oxide and integrally forms the conductive interconnects to exposed contacts and protected internal MEMS structures.

The OPD embodiment at 191 is similar in structure to that formed at 181, but with OPD contact patterning in the piezoelectric layer (e.g., aluminum nitride, AlN) followed by deposition of a contact material (e.g., ISDP) that may be thermally annealed to form n-regions within a p-well in the underlying single-crystal silicon layer. In the example shown, an optional isolation trench is formed (e.g., etched) around the p-well to electrically isolate that region (which forms the shared anode of the back-to-back OPD diodes or base of the OPD BJT) from highly n-doped single-crystal silicon that forms the resonator field area and resonator body.

In the arrangement at 193, through-silicon trenches, lined with n-doped regions, are formed within a single-crystal silicon region of the device-layer material stack to instantiate back-to-back OPD diodes (or BJT). As in the through-silicon trench approach in the lid layer, the conductive trench-fill material may also serve as the side-wall dopant source—in which case, the trench-fill material extends through openings in the piezoelectric film to form integral electrical interconnects with respect to exposed contacts and corresponding internal MEMS features.

In each of the piezo-layer patterning examples shown at 191 and 193, n-type dopant is diffused, implanted or otherwise imbued within p-type device-layer silicon (e.g., to yield highly/degenerately n-doped silicon) prior to piezoelectric film deposition. As shown, the p-well or p-type region) may be effected by oxide-masking prior to n-doping—a process step that may be omitted in embodiments that lack n-doped device-layer silicon.

Figures 3, 4, 5, 6:
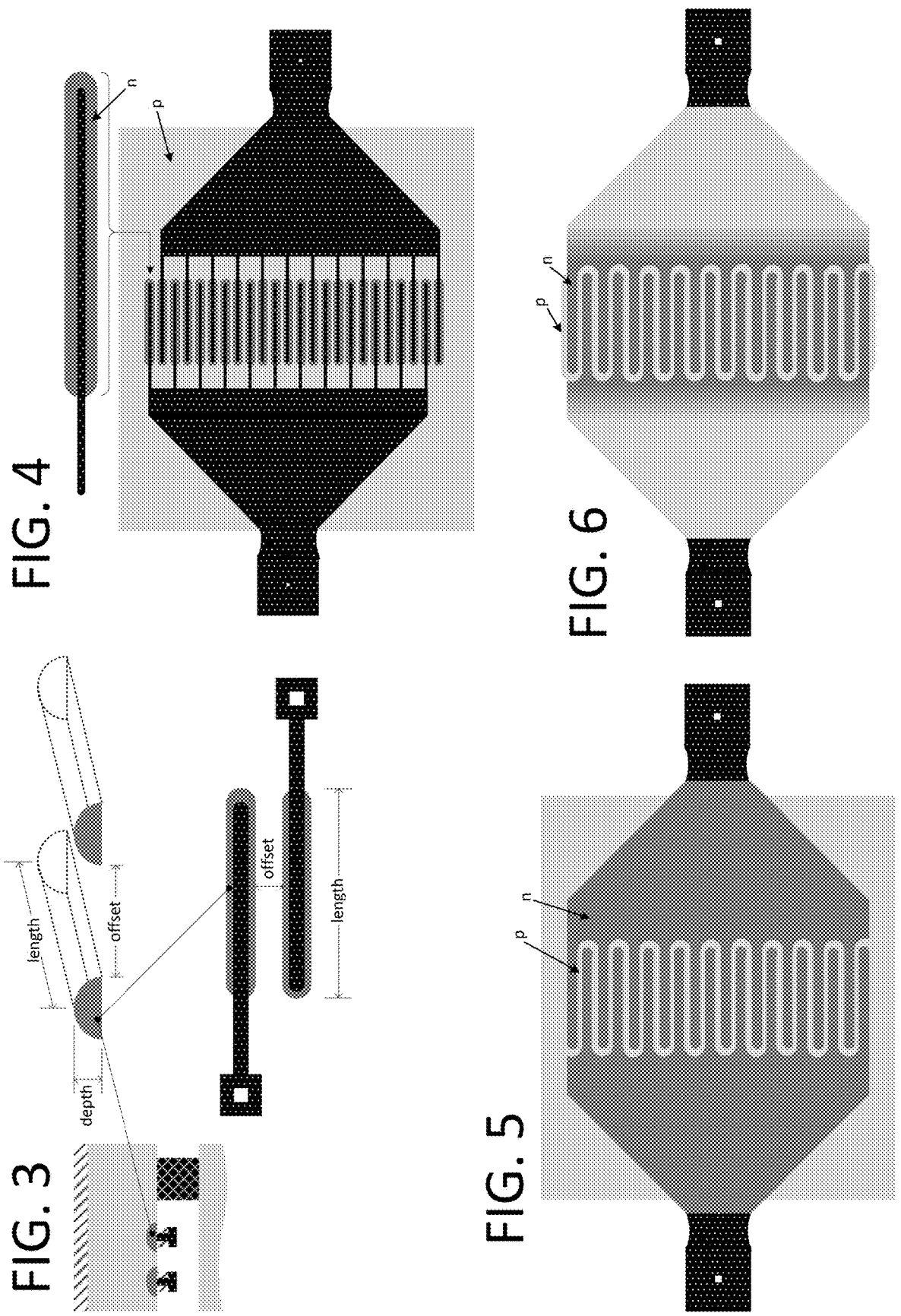
FIG. 3 illustrates exemplary sizing and geometric char-acteristics bearing on OPD design.
FIG. 4 illustrates an interdigitation geometry that enables formation of relatively lengthy back-to-back n-p junctions within a compact OPD footprint.
FIGS. 5 and 6 illustrate alternative interdigitated OPD embodiments.

In a number of embodiments, OPD size and geometric configuration are engineered to enable safe (non-destructive) conduction of a specified discharge current—generally to achieve a desired junction area and thus a desired n-region depth, length and, where BJT snap-back is desired, offset between adjacent p-n junctions as shown in FIG. 3. In the case of depth-limited surface dopant deposition (e.g., implant, diffusion), controllable parameters collapse to junction length and junction-to-junction offset. FIG. 4 illustrates an interdigitation approach that enables formation of relatively lengthy back-to-back n-p junctions within a compact OPD footprint—in effect routing each junction in two dimensions (laterally and vertically within the depicted drawing) through multiple n-type digits that project into a p-type region and interleave with projecting digits from the counterpart n-p junction. The specific footprint shown may be varied in aspect ratio and geometry (e.g., rendered in a square format and thus 1:1 aspect ratio to maximize the junction length per quadrilateral area, or rendered in a spiraled circular configuration to maximize junction length per diode area). Further, while individual n-type digits are depicted as discrete elements interconnected by metal or other conductive material (e.g., n$^+$poly) in the FIG. 4 example, the digits may extend integrally from a terminal-interconnected n-type region as shown in FIG. 5 (dark shading is n-type region, lighter shading is p-type region as in other drawing figures herein) or from a unified n-type region coupled to a terminal through an intervening p-type region as shown in FIG. 6.

FIGS. 7, 8 and 9 relate to hot-spot mitigation within individual OPD structures—materials and feature geometries selected to equalize current distribution through the OPD junction area and thus avoid destructive heating due to concentrated carrier flow through relatively low resistance regions of the n-p junction. FIG. 7 contrasts current conduction path lengths within a generalized dopant diffusion profile 221 with those in a path-matched dopant diffusion geometry 225. As shown, the profile at 221 is characterized by substantially different path lengths (d1<d2<d3) between conductive contact 223 and respective junction-boundary locations along the diffusion cross-section and thus correspondingly different conductances that will yield disparate discharge current conduction and disproportionate heating along path d1. By contrast, the path-matched geometry is engineered (e.g., by dopant source distribution, deposition methodology and/or anneal time/temperature) to equalize the path lengths and conductances between contact and junction boundaries.

In the embodiment of FIG. 8, the conductor-to-cathode interconnect is implemented with a relatively high TCR (temperature-coefficient-of-resistance) material to intrinsically equilibrate current flow within the cross-sectional area of that interconnect—that is, a predominate current conduction in one region of the relatively high TCR material (i.e., higher TCR than metal) will raise the temperature of that region, increasing its resistance and thus reducing the current. In the particular embodiment shown, a primary conductive contact 235 is implemented by metal (or other relatively low-TCR conductor), but is ballasted by a heavily-doped polysilicon distribution layer 237, the latter having a higher TCR than the primary contact to provide current flow equilibration through its cathode interconnect (i.e., an interface at 239 that extends into the plane of the drawing figure). FIG. 9 illustrates a top-view of an interdigitated diode pair in which metal contact fingers are ballasted by heavily-doped polysilicon cathode-interconnect structures (the metal-to-polysilicon connection being omitted to avoid obscuring the polysilicon-cathode interface).

FIGS. 10 and 11 illustrate exemplary embodiments of through-silicon OPD structures. In the FIG. 10 embodiment, through-silicon trenches are etched or otherwise formed in the subject silicon layer (e.g., a p-type silicon lid layer, device layer or handle layer), filled or lined with an n-type dopant source and then thermally annealed to yield adjacent n-type regions that extend through the subject silicon layer (i.e., separated by residual p-type silicon region). As discussed in FIG. 2, the trench-fill dopant source may be left in situ to form the cathode interface (the n-type region constituting the cathode of a diode) or may be stripped, followed by subsequent deposition of contact metal (e.g., tungsten). Also, while a single pair of parallel roughly cuboidal n-type regions are depicted, such features may be interdigitated to further increase junction area and/or curved, circular or arched geometries may be implemented (also increasing junction area within a given die area footprint. FIG. 11 illustrates a special case of the FIG. 10 embodiment in which one of the through-silicon trenches fully encompasses the other—in this case in a concentric arrangement in which a first outer trench encircles a columnar inner trench. One benefit of this nested-trench geometry (the inner and outer trenches or either of them may have polygonal rather than circular geometries) is the inherent isolation of the residual p-type region between the two n-type diffusions (the latter resulting from dopant-source trench-fill and anneal). That is, the OPD will function as intended despite purposeful or inadvertent electrical connection to the p-type region outside the exterior n-region. Terminal interconnections to the concentric diodes may be implemented by routing conductive traces to the respective n-regions (e.g., to electrically contact remnant doped-polysilicon trench-fill) on opposite sides of the subject silicon layer or on the same side of the silicon layer with dielectric separation.

In a number of embodiments, particularly those with bonded lids, particulate generated during die singulation (or other processing steps) may electrically couple a putatively floating region of the MEMS device to a contact-connected structure. This otherwise benign circumstance may become problematic if the shorted device region is intended to serve as the shared floating anode of an OPD diode pair (or floating base of a BJT)—preventing proper functioning of the OPD. In a number of embodiments, this consequence is avoided by electrically isolating the floating p-type region of the OPD from external exposure or at least from exposure to particulate produced by singulation dicing. In the chip-scale isolation embodiment of FIG. 12, for example, a through-silicon isolation structure is implemented in the OPD layer (lid, device or handle layer, whichever contains the floating p-type OPD region) around the entire MEMS device (e.g., offset from the device edge by a predetermined distance). In the depicted implementation, the isolation structure is implemented by a conductive through-silicon via, optionally coupled to an exposed contact (e.g., ground contact) of the MEMS device, but electrically isolated from the floating interior p-region through a dielectric via lining (e.g., oxide lining). In other embodiments, the conductive via itself may be floating (though still electrically isolated from the interior p-region) and/or the via may be non-conductive (e.g., filled with oxide). FIG. 13 illustrates a similar isolation approach, but with the isolation structure limited to a local region of the subject silicon layer instead of forming a chip-scale isolation boundary. Though depicted as fully enclosed by the isolation structure, the local p-region of interest may be bounded in part by an edge of the singulated die (e.g., an edge or region thereof subject to particulate removal or otherwise not susceptible to particulate short-out). Also, in both the FIGS. 12 and 13, the isolation trench may terminate at (or extend through) any dielectric layer including, for example, the buried oxide between handle and device-layer silicon, a piezoelectric layer (e.g., aluminum nitride or other), etc.

FIG. 14 illustrates an alternative p-region isolation approach in which lid-layer silicon is n-doped to form an n-type topside layer that serves to isolate the remaining/underlying p-type silicon layer. An isolation trench which may optionally be oxide lined and filled as shown at 350 is provided to effect a chip-scale or local isolation of the p-type region of interest. In alternative embodiments, structures equivalent to those shown in FIG. 14 may be achieved by implementing a p-well within an otherwise n-type silicon layer (or n-type region of a silicon layer) and forming the OPD therein.

Figure 15:
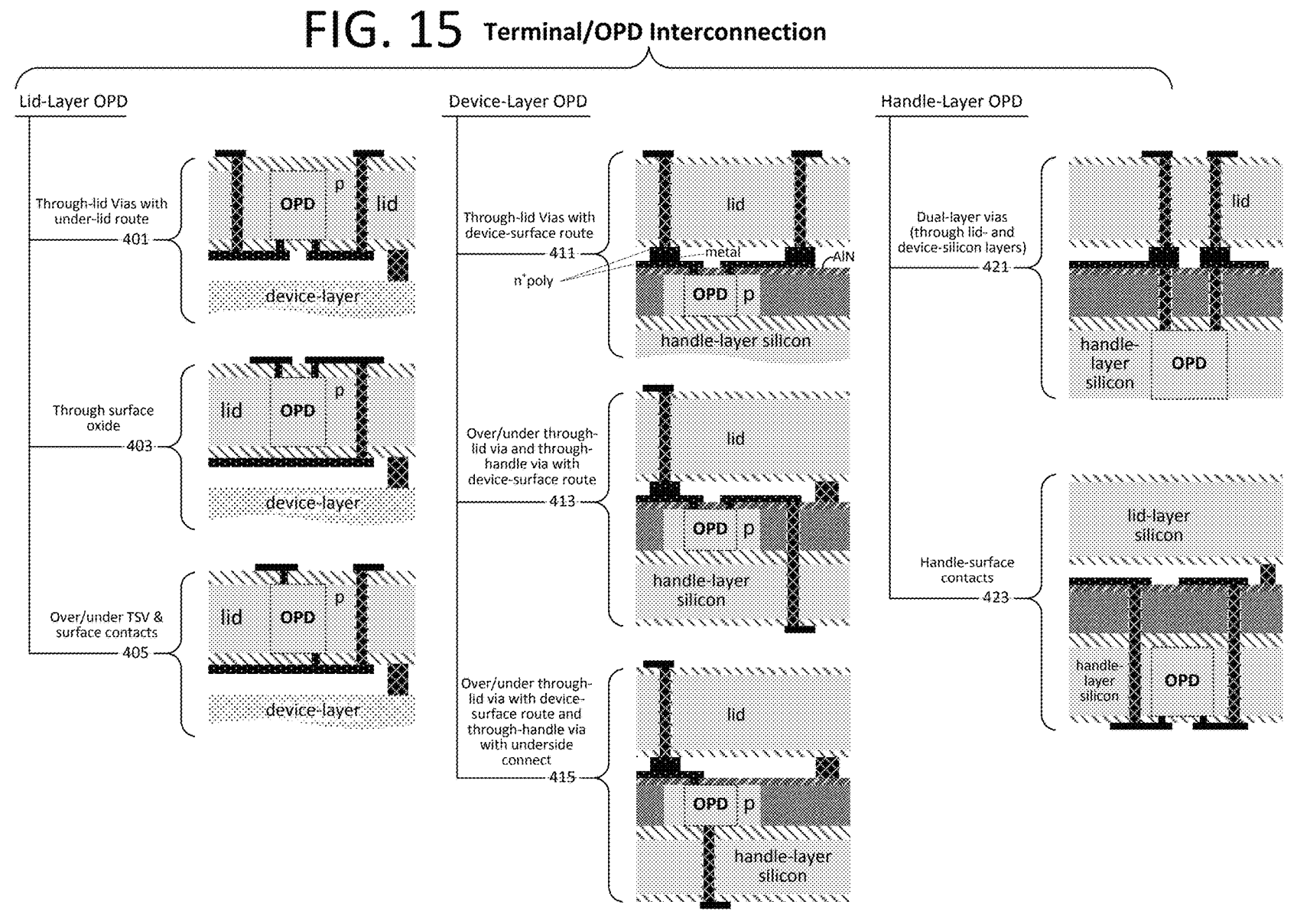

FIG. 15 illustrates exemplary interconnections between contacts (terminals) and over-voltage protection devices implemented in various silicon layers of a MEMS device. In the case of lid-layer OPD implementation (e.g., diodes formed adjacent upper or interior lid-layer surface or through lid-layer silicon represented collectively by the OPD outline shown) through-lid vias may interconnect lid-surface contacts with under-lid conductive routing to the OPD and interior MEMs features as shown at 401. Alternatively, OPD interconnects may be routed through the surface oxide as shown at 403 or, in the over/under hybrid at 405, one OPD interconnect may be routed through the surface oxide while the other is routed through silicon to a bottom-side OPD contact point.

With respect to device-layer OPD implementation, surface contacts may extend through both the lid-silicon layer (e.g., TSVs) and through any interstitial oxides or voids through, for example, a conductive contact stack to the OPD (n⁺poly-metal-n⁺poly in the example shown at 411). Alternatively, through-silicon vias may be routed through both the lid-layer and handle-layer silicon (the latter also extending through the device-layer silicon) to counterpart routing elements between the lid layer and device layer as shown at 413. In yet another device-layer OPD embodiment, through-handle TSV is routed directly to a bottom-side OPD contact (i.e., instead of extending to the lid-device interstice. In that case, depicted at 415, the handle-side contact may be coupled to other MEMS structures (including ground rail) through routing not shown.

In handle-layer OPD implementations, multi-layer vias may be formed through both the lid-layer and device-layer silicon, extending through the bottom oxide to contact the OPD as shown at 421. Alternatively, one or both contacts may be coupled directly to the handle-layer OPD via bottom-side interconnects as shown at 423.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, any of the specific materials, dimensions (thicknesses), concentrations, operational order (e.g., order of device fabrication steps), temperatures and the like can be different from those described above in alternative embodiments. Oxides may include various silicon oxides (e.g., silicon dioxide (SiO₂, silicon oxynitride (SiOₓNᵧ), etc.) and/or other dielectric materials compatible with silicon wafer processing. The term "coupled" is used herein to express a direct connection as well as a connection through one or more intervening functional components or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A semiconductor device comprising:
a microelectromechanical systems (MEMS) resonator having a body adapted to vibrate, the body being hermetically sealed within a cavity of the semiconductor device;
first and second electrical contacts disposed on an exterior surface of the semiconductor device;
an electrode within the cavity of the semiconductor device, the electrode being electrically coupled to the first electrical contact to receive drive impetus therefrom, the drive impetus to cause the body to vibrate;
an over-voltage protection device electrically coupled between the first and second electrical contacts.

2. The semiconductor device of claim 1, wherein the body comprises a layer of degenerately-doped silicon and a layer of a piezoelectric material.

3. The semiconductor device of claim 2, wherein the layer of degenerately-doped silicon is doped with an N-type dopant and wherein the electrode comprises the layer of degenerately-doped silicon.

4. The semiconductor device of claim 1, wherein the body comprises highly-doped crystal silicon and wherein the over-voltage protection device comprises a bipolar junction transistor having a first polar region at least partially formed from highly-doped crystal silicon.

5. The semiconductor device of claim 1, wherein the over-voltage protection device comprises a bipolar junction transistor having a first polar region at least partially formed from highly-doped crystal silicon, wherein the semiconductor device comprises a bonded lid also having a layer of the highly-doped crystal silicon, and wherein the bonded lid further comprises an isolation trench to electrically isolate a second polar region of the bipolar junction transistor from the layer of the highly-doped crystal silicon.

6. The semiconductor device of claim 1, wherein the over-voltage protection device comprises a bipolar junction transistor having a first polar region at least partially formed from highly-doped crystal silicon, and wherein the semiconductor device comprises a deposited lid layer, also comprising the highly-doped crystal silicon, and wherein an isolation trench is defined in the deposited lid layer to electrically isolate a second polar region of the bipolar junction transistor from the layer of the highly-doped crystal silicon.

7. The semiconductor device of claim 1 wherein the over-voltage protection device comprises diodes which are electrically arranged back-to-back, each of the diodes having a first polar region at least partially formed from highly-doped silicon, wherein the semiconductor device comprises a bonded lid also having a layer of the highly-doped silicon, and wherein the bonded lid further comprises an isolation trench to electrically isolate a second polar region of the each of the diodes from the layer of the highly-doped silicon.

8. The semiconductor device of claim 7, wherein the isolation trench is filled with a silicon-oxide material.

9. The semiconductor device of claim 1 wherein the over-voltage protection device comprises diodes which are electrically arranged back-to-back, each of the diodes having a first polar region at least partially formed from highly-doped silicon, wherein the semiconductor device comprises a deposited lid layer, also comprising the highly-doped silicon, and wherein an isolation trench is formed in the deposited lid layer to electrically isolate a second polar region of the each of the diodes from the layer of the highly-doped silicon.

10. The semiconductor device of claim 1, wherein the semiconductor device comprises a layer of highly-doped crystal silicon, wherein at least one of the body and the electrode is at least partially formed from the layer of highly-doped crystal silicon, wherein the over-voltage protection device comprises a bipolar device having a first polar region and a second polar region, the first polar region comprises a portion of the layer of highly-doped crystal silicon, the semiconductor device further having an isolation region which electrically isolates the second polar region from the layer of high-doped crystal silicon, wherein the first polar region is in electrical communication with the first electrical contact and wherein the second polar region is in electrical communication with the second electrical contact.

11. The semiconductor device of claim 1, wherein the electrode is a first electrode and wherein the semiconductor device comprises a second electrode, the first electrode to electrostatically-drive the MEMS resonator to resonant motion, the second electrode to electrostatically-sense motion of the MEMS resonator and to provide an electrical output dependent thereon, each of the first electrode and the second electrode operatively disposed adjacent a boundary of said cavity, the body disposed within the cavity between the first electrode and the second electrode.

12. The semiconductor device of claim 11, wherein the second electrode is electrically coupled to the second electrical contact, such that the second electrical output provides a terminal for the electrical output dependent on the sensed motion of the MEMS resonator.

13. The semiconductor device of claim 1, wherein the electrode is a first electrode, wherein the semiconductor device comprises a second electrode which is operatively coupled to the second electrical contact, wherein the MEMS resonator is mechanically supported by a silicon substrate, wherein one of the first electrical contact and the second electrical contact is formed on an exterior surface of the silicon substrate, and wherein a through-silicon via is defined through the silicon substrate, to electrically couple at least one of:

the first electrode with the first electrical contact; or
the second electrode with the second electrical contact.

14. A semiconductor device comprising:

a microelectromechanical systems (MEMS) resonator having a body adapted to vibrate, the body being hermetically sealed within a cavity of the semiconductor device;

first and second electrical contacts disposed on an exterior surface of the semiconductor device;

wherein the body has a layer of degenerately-doped silicon and a piezoelectric layer, the layer of degenerately-doped silicon to serve as an electrode within the cavity of the semiconductor device, and being electrically coupled to the first electrical contact to receive drive impetus therefrom, the drive impetus to cause the body to vibrate;

an over-voltage protection device electrically coupled between the first and second electrical contacts.

15. The semiconductor device of claim 14, wherein the semiconductor device comprises a silicon crystal substrate that provides at least one of mechanical support for the MEMS resonator or encapsulation of the cavity relative to a second substrate, and wherein the over-voltage protection device comprises first and second polar regions, each defined by respective, doped portions of the silicon crystal substrate.

16. A semiconductor device comprising:

a microelectromechanical systems (MEMS) resonator having a body adapted to vibrate, the body being hermetically sealed within a cavity of the semiconductor device;

first and second electrical contacts disposed on an exterior surface of the semiconductor device;

wherein the body is separated within the cavity from a drive electrode by a gap, and is also separated from a sense electrode within the cavity by a gap, the body having a layer of degenerately-doped silicon, the drive electrode being electrically coupled to the first electrical contact to receive drive impetus therefrom, the drive impetus to cause the body to vibrate;

an over-voltage protection device electrically coupled between the first and second electrical contacts.

17. The semiconductor device of claim 16, wherein the second electrode is electrically coupled to the second electrical contact, such that the second electrical output provides a terminal for output of an electrical output dependent on the sensed motion of the MEMS resonator.

18. The semiconductor device of claim 16, wherein the semiconductor device comprises a silicon crystal substrate that provides at least one of mechanical support for the MEMS resonator or encapsulation of the cavity relative to a second substrate, and wherein the over-voltage protection device comprises first and second polar regions, each defined by respective, doped portions of the silicon crystal substrate.

19. The semiconductor device of claim 16, wherein the second electrical contact is to be couped to a fixed electrical potential during operation of the MEMS resonator.

20. A semiconductor device comprising:

a microelectromechanical systems (MEMS) resonator having a body, the body adapted to vibrate and being hermetically sealed within a cavity of the semiconductor device, the body being at least partially formed from degenerately-doped silicon;

first and second electrical contacts disposed on an exterior surface of the semiconductor device;

an electrode within the cavity of the semiconductor device, the electrode being electrically coupled to the first electrical contact to receive drive impetus therefrom, the drive impetus to cause the body to vibrate;

an over-voltage protection device electrically coupled between the first and second electrical contacts;

wherein the over-voltage protection device comprises first and second polar regions, the first polar region being formed from the degenerately-doped silicon.

21. The semiconductor device of claim 20, wherein the MEMS resonator is a piezoelectric resonator and wherein the body comprises a layer of piezoelectric material and the electrode.

22. The semiconductor device of claim 20, wherein the electrode is also formed from the degenerately-doped silicon.

* * * * *